US006777297B2

(12) United States Patent
Juengling

(10) Patent No.: US 6,777,297 B2
(45) Date of Patent: Aug. 17, 2004

(54) DISPOSABLE SPACER AND METHOD OF FORMING AND USING SAME

(75) Inventor: Werner Juengling, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/218,825

(22) Filed: Aug. 14, 2002

(65) Prior Publication Data

US 2003/0003750 A1 Jan. 2, 2003

Related U.S. Application Data

(62) Division of application No. 09/573,741, filed on May 18, 2000, now Pat. No. 6,436,752, which is a continuation of application No. 08/755,449, filed on Nov. 22, 1996, now Pat. No. 6,087,239.

(51) Int. Cl.[7] .................. H01L 21/336; H01L 21/76; H01L 21/311
(52) U.S. Cl. .................. 438/294; 438/437; 438/444; 438/445; 438/700
(58) Field of Search .................. 438/437, 444, 438/439, 445, 700

(56) References Cited

U.S. PATENT DOCUMENTS

| 5,196,367 | A | * | 3/1993 | Lu et al. ............... 438/298 |
| 5,212,110 | A | * | 5/1993 | Pfiester et al. ........ 438/222 |
| 5,250,818 | A | | 10/1993 | Saraswat et al. |
| 5,371,035 | A | | 12/1994 | Pfiester et al. |
| 5,389,557 | A | | 2/1995 | Jung-Suk |
| 5,432,118 | A | * | 7/1995 | Orlowski et al. ...... 438/444 |

(List continued on next page.)

FOREIGN PATENT DOCUMENTS

GB        2 249 867        5/1992

OTHER PUBLICATIONS

Koschier et al. "Efficiency Improvements in Thin Film Silicon Solar Cells using $SI_{1-x}GE_x$ Alloys," $2^{nd}$ World Conference and Exhibition on Photovoltaic Solar Energy Conversion, Vienna, Austria; Jul. 6–10, 1998.
K. Koyama et al., "Etching characteristics of $Si_{1-x}Ge_x$ Alloy in ammoniac wet cleaning," Appl. Phys. Lett., Nov. 19, 1990; 57(21): 2202–2204.
Whiteaker et al., "Compositional ordering in SiGe alloy thin films," Physical Review B, May 15, 1998; 57(19); 410–420.

Primary Examiner—John F. Niebling
Assistant Examiner—Ron Pompey
(74) Attorney, Agent, or Firm—Mueting, Raasch & Gebhardt, P.A.

(57) ABSTRACT

A disposable spacer for use in a semiconductor device fabrication process is formed of a germanium-silicon alloy. The germanium-silicon alloy may include a first portion (x) of germanium and a second portion (1-x) of silicon, wherein x is greater than about 0.2. A method of forming the disposal spacer includes providing a device structure and forming a layer of germanium-silicon alloy on the device structure. The layer is then etched to form the disposable spacer. The device structure may include a substrate and a gate structure with the disposable spacers formed at sidewalls thereof. Further, the device structure may include a substrate having an oxidation mask formed thereon with the disposable spacers formed relative to sidewalls of the oxidation mask. In addition, the method includes removing the disposable spacer by oxidizing the spacer to form volatile $Ge_xSi_yO$. Any unvolatilized $Ge_xSi_yO$ may be removed using water. Further, the removal step may be performed using a cleaning solution including ammonium hydroxide.

22 Claims, 17 Drawing Sheets

U.S. PATENT DOCUMENTS

| | | |
|---|---|---|
| 5,461,250 A | 10/1995 | Burghartz et al. |
| 5,491,099 A | 2/1996 | Hsu |
| 5,543,339 A | 8/1996 | Roth et al. |
| 5,591,653 A | 1/1997 | Sameshima et al. |
| 5,592,017 A * | 1/1997 | Johnson ..................... 257/554 |
| 5,780,350 A | 7/1998 | Kapoor |
| 5,821,146 A | 10/1998 | Chang et al. |
| 5,846,867 A | 12/1998 | Gomi et al. |
| 5,933,748 A * | 8/1999 | Chou et al. ................. 438/431 |
| 5,977,560 A | 11/1999 | Banerjee et al. |
| 6,087,239 A | 7/2000 | Juengling |
| 6,436,752 B1 | 8/2002 | Juengling |
| 2002/0173093 A1 | 11/2002 | Juengling |

\* cited by examiner

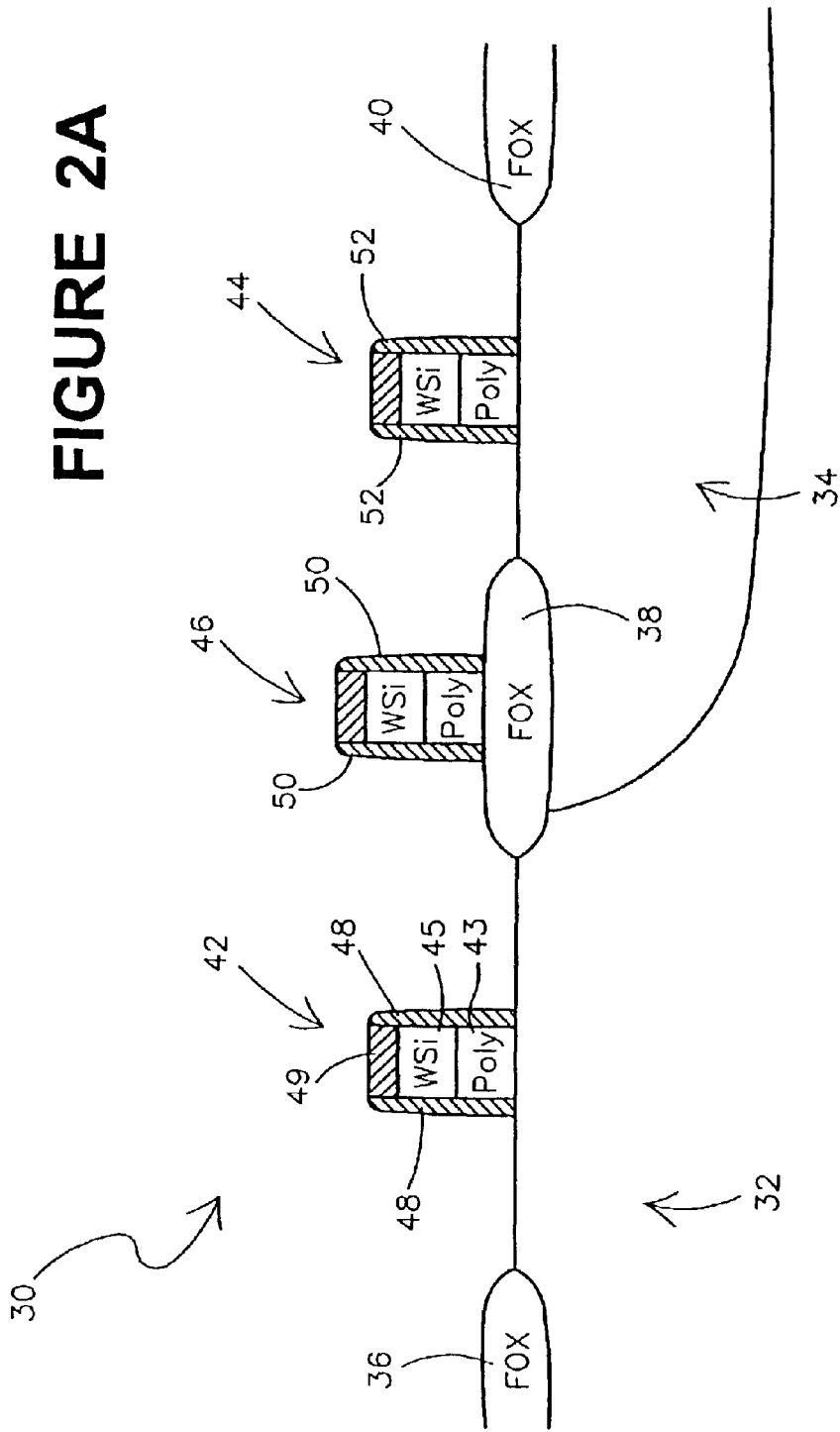

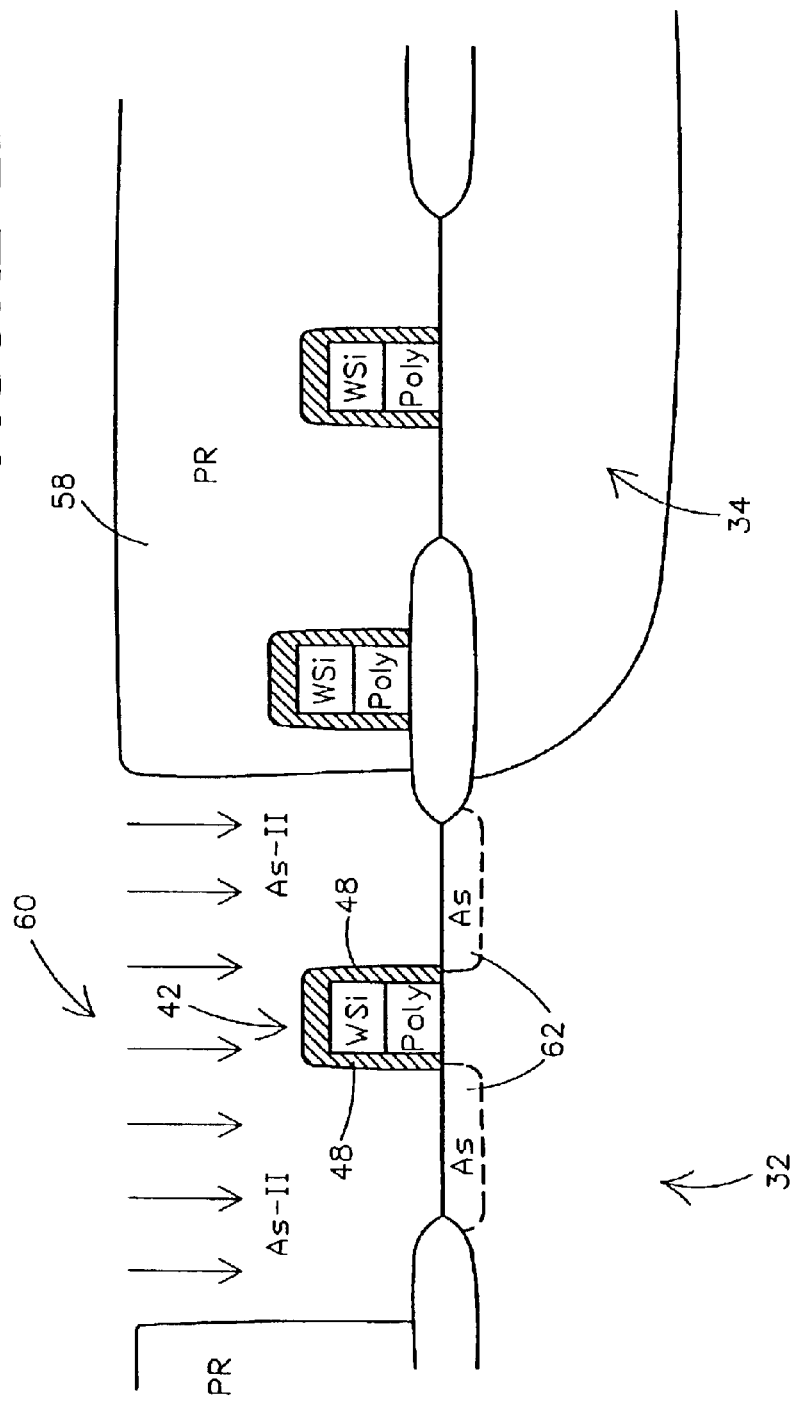

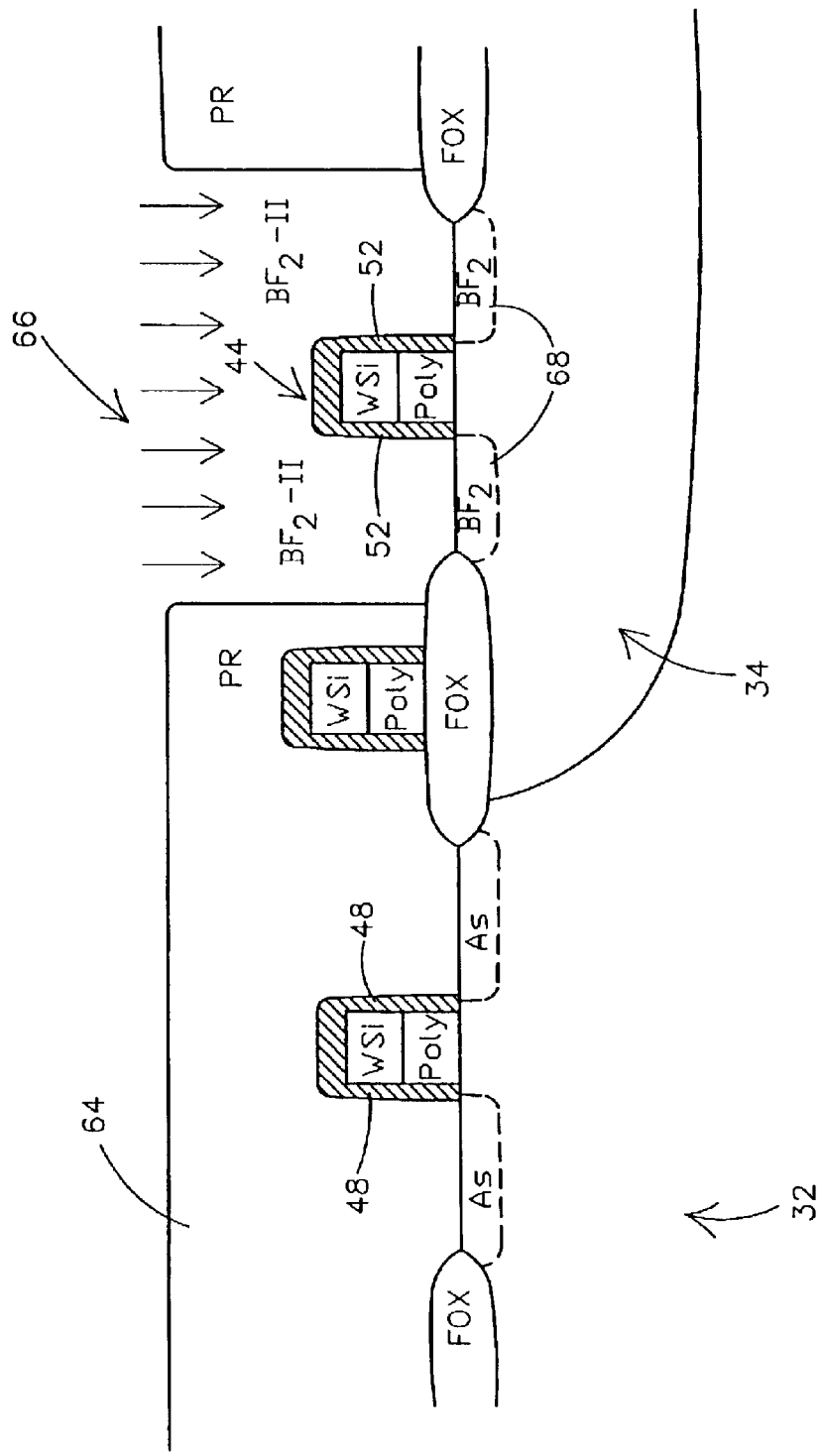

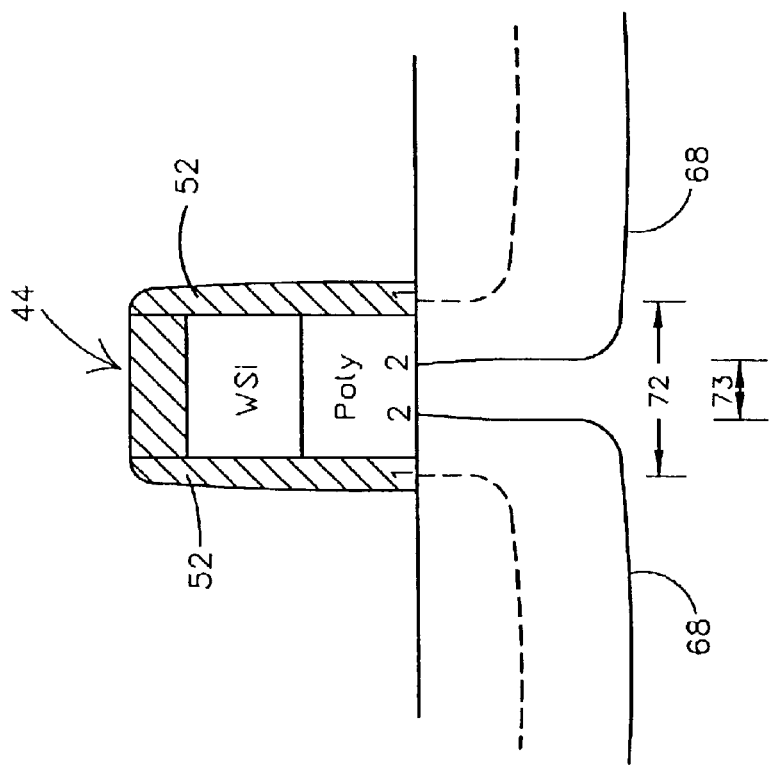
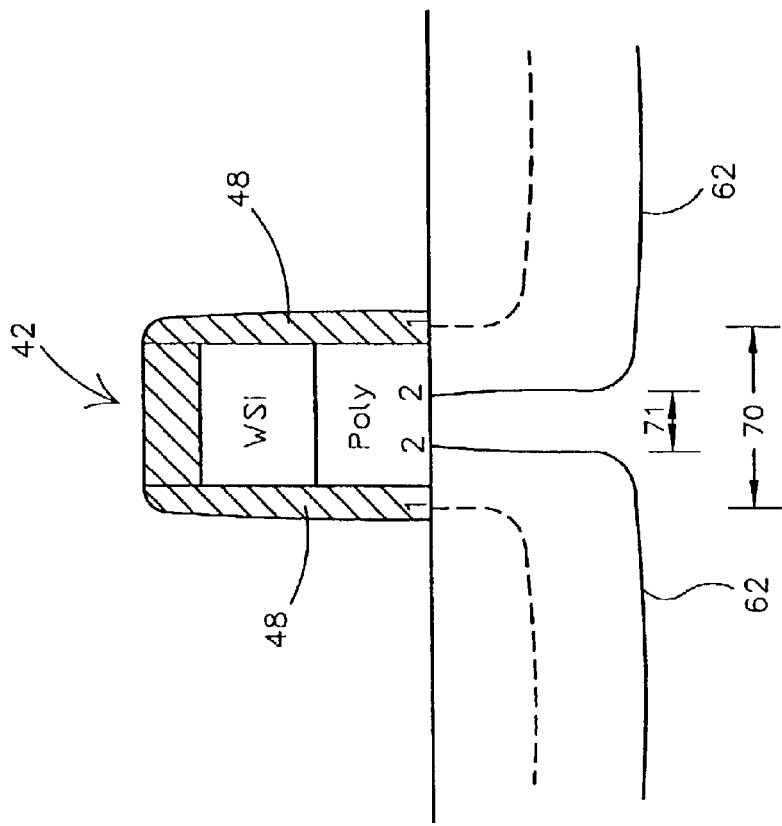

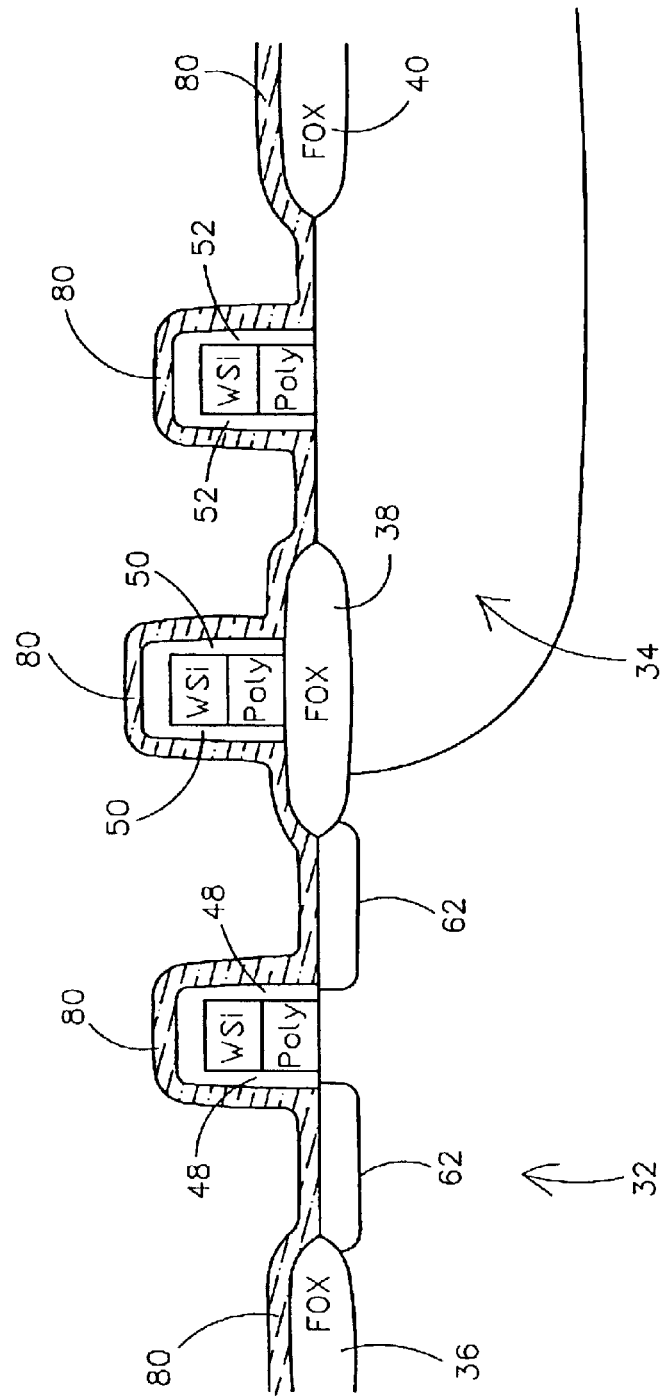

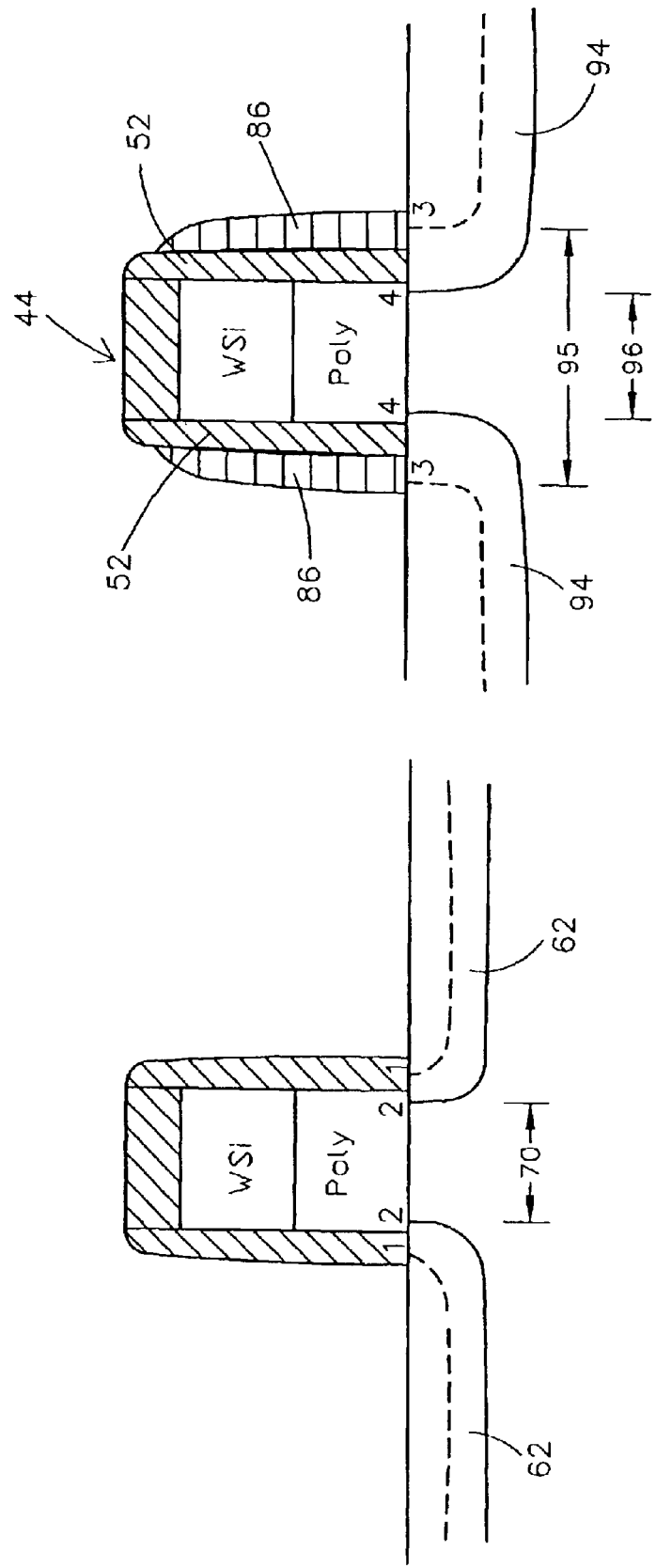

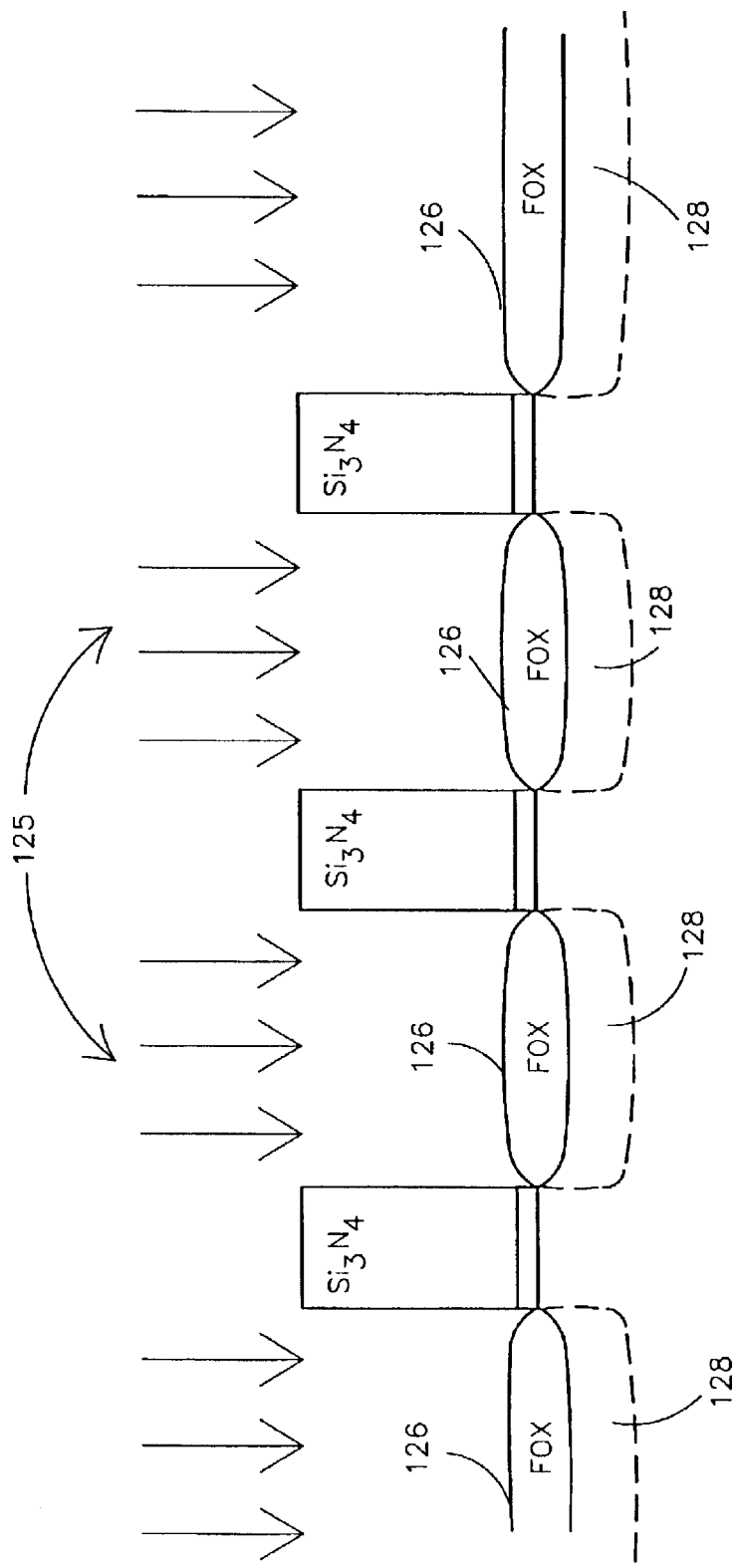

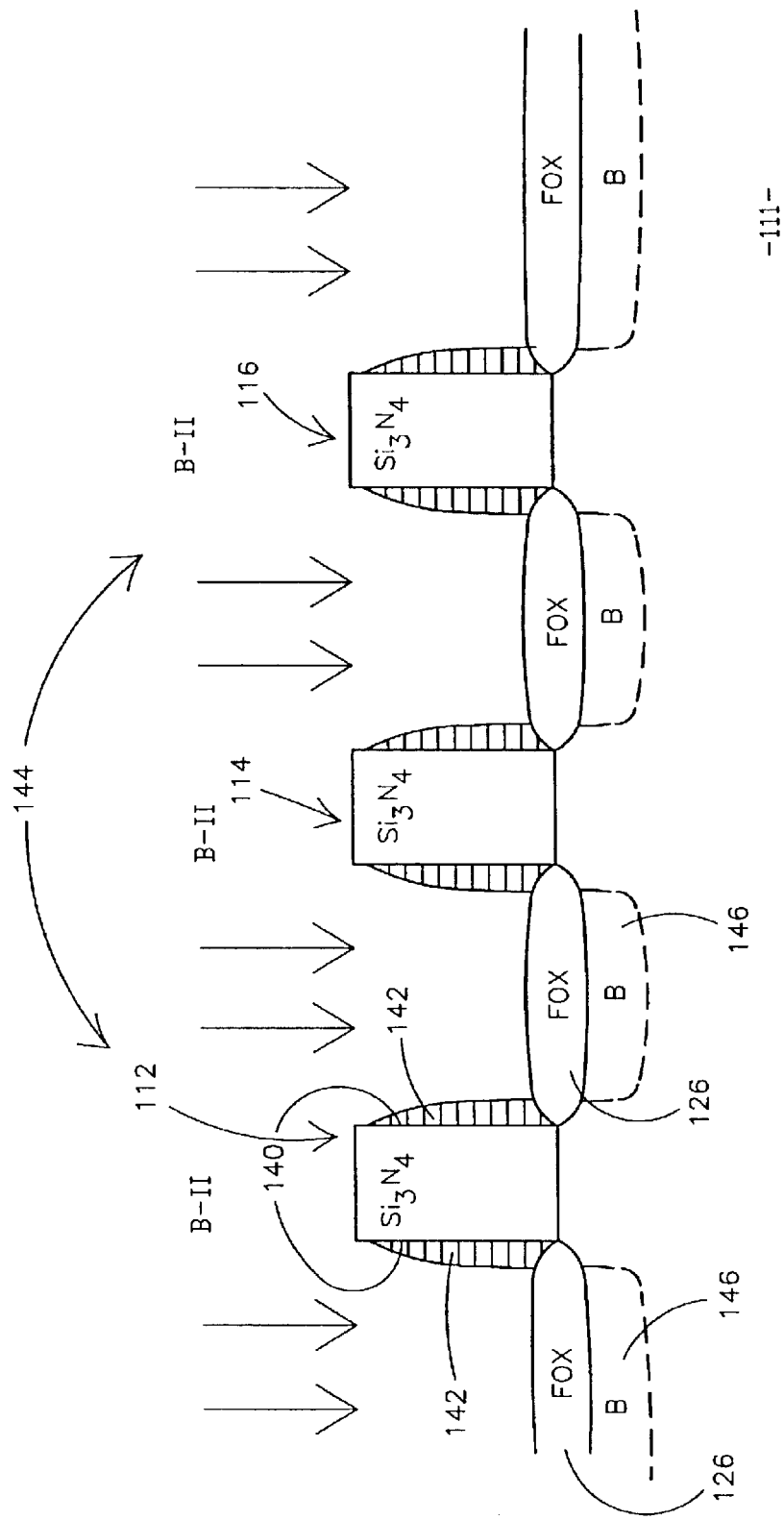

# DISPOSABLE SPACER AND METHOD OF FORMING AND USING SAME

This is a divisional of application Ser. No. 09/573,741, filed May 18, 2000, now U.S. Pat. No. 6,436,752, which is a continuation of application Ser. No. 08/755,449, filed on Nov. 22, 1996, (issued as U.S. Pat. No. 6,087,239 on Jul. 11, 2000

FIELD OF THE INVENTION

The present invention relates to the fabrication of semiconductor devices. More particularly, the present invention relates to disposable spacers, methods of forming such disposable spacers, and methods of using such disposable spacers.

BACKGROUND OF THE INVENTION

As the size of semiconductor devices decreases, various problems arise. Particularly, the control of device characteristics, such as transistors, becomes more difficult as the feature size of devices goes below one micron. In order to control device characteristics, it is important to control processes such as ion implantation and etching during the fabrication of these devices. One technique for controlling such processes involves the use of permanent spacers and disposable spacers. For example, spacers may be utilized to offset the implantation of ions relative to another structural feature of the device or offset an etch of a material relative to a different region of the device being fabricated.

For illustration, in submicron CMOS technologies, PMOS devices typically show a short channel behavior, which is partly caused by lateral diffusion of a dopant, such as boron, into the gate channel of the PMOS device after implant of active areas of the PMOS device. Although, typically, a permanent spacer is utilized for offset of the ion implant from the gate edge in order to widen the gate channel, the spacer width for the PMOS device is usually determined based on the spacer width necessary to create an adequately sized gate channel for NMOS devices fabricated at the same time. Such a spacer width is typically too small to account for the larger diffusion of, for example, boron, into the gate channel of the PMOS device, as opposed to the diffusion of arsenic into the gate channel of an NMOS device. As such, the gate channel is usually shorter than desired for the PMOS device.

Typically, the gate has a large stack height that permits the formation of an additional spacer for PMOS devices to offset the ion implant (i.e., boron) further from the gate so as to allow for greater lateral diffusion in the underlying substrate. Various spacer materials are available; however, use of such spacers creates other problems. For example, a polysilicon spacer could be utilized to offset the implant. However, the removal of the polysilicon spacer after the implant is performed, is difficult to achieve without leaving stringers or over etching into the poly gate or substrate. Further, for example, a silicon nitride spacer if used creates too small of a permanent gap between narrowly spaced gates (i.e., wordlines) for the formation of a bit line contact therebetween. Further, for example, an oxide spacer could also be utilized. However, the removal of the oxide spacer would lead to a loss of field oxide.

An additional illustration of controlling semiconductor device characteristics through the use of fabrication techniques includes the use of an ion implantation in a local oxidation of silicon (LOCOS) process to optimize isolation between the active areas of the devices fabricated. Such a field implant during the LOCOS process is commonly referred to as a channel stop implant. However, the channel stop implant introduces a dopant diffusion encroachment problem wherein the dopant laterally diffuses into active area/channel regions formed by the LOCOS process. The overall effect is that the width of the channel/electrical active area being formed by the LOCOS process is undesirably reduced.

More particularly, a silicon nitride mask is typically utilized as the oxidation mask for the LOCOS process. Although spacers have been formed relative to the silicon nitride mask for offsetting the channel stop implant, such spacers also cause problems as in the case of polysilicon, silicon nitride, or oxide spacers. Such problems include changing the shape of the field oxide grown, removal of portions of the field oxide during etching of the spacer such as with use of an oxide spacer, or, for example, some of the materials may not be selectively etchable relative to the oxidation mask. For example, if a silicon nitride spacer is utilized with a silicon nitride oxidation mask, selective removal would not be possible.

For the above reasons, there is a need in the art for new disposable spacers, in addition to methods of forming and using such spacers to provide desirable semiconductor device characteristics. The present invention, as described below, overcomes the problems described above and other problems which will become apparent to one skilled in the art from the description below.

SUMMARY OF THE INVENTION

The present invention includes a disposable spacer for use in a semiconductor device fabrication process. The disposable spacer is formed of a germanium-silicon alloy.

In one embodiment of the invention, the germanium-silicon alloy includes a first portion (x) of germanium and a second portion (1-x) of silicon, wherein x is greater than about 0.2. In another embodiment of the invention, the germanium-silicon alloy includes a first portion (x) of germanium and a second portion (1-x) of silicon, wherein x is greater than about 0.7.

A method of forming a disposal spacer in accordance with the present invention is also described. The method includes providing a device structure and depositing a layer of germanium-silicon alloy on the device structure. The layer is then etched to form the disposable spacer.

In one embodiment of the forming method, the layer is dry etched to form the disposable spacer. In additional embodiments of the forming method, the device structure includes a substrate and a gate structure with the disposable spacers formed at sidewalls thereof. Further, the gate structure may have permanent spacers formed at sidewalls thereof. The disposable spacers are then formed upon the permanent spacers. Further, the device structure may include a substrate having an oxidation mask formed thereon with the disposable spacers formed relative to sidewalls of the oxidation mask.

In another method in accordance with the present invention for use in fabricating semiconductor devices, the method includes providing a first region of material and a second region of material positioned relative to the first region of material. A disposable spacer is formed using a germanium-silicon alloy adjacent a portion of both the first region of material and second region of material.

In one embodiment of the method, a portion of the first material offset relative to the second region of material by the disposable spacer is materially altered. Further, the material alteration may include implanting the portion of the first region of material offset relative to the second region of material by the disposable spacer. Further, the material alteration may include etching the portion of the first region of material offset relative to the second region of material by the disposable spacer.

In another embodiment of the method, the method includes removing the disposable spacer. Further, the removing of the disposable spacer may be performed by oxidizing the spacer to form volatile $Ge_xSi_yO$. Any unvolatilized $Ge_xSi_yO$ may be removed using water. Further, the removal step may include removing the spacer with a cleaning solution including ammonium hydroxide.

In another method in accordance with the present invention for use in fabricating semiconductor devices, the method includes providing a first region of material and forming a second region of material at a position relative to the first region of material. The second region of material has a surface in contact with and extending from the first region of material. A disposable spacer is formed from a germanium-silicon alloy on a portion of the surface of the second region of material. The disposable spacer extends over a first portion of the first region of material. A second portion of the first region of material offset relative to the second region of material by the disposable spacer is then implanted.

In yet another method in accordance with the present invention for use in fabricating semiconductor devices, the method includes providing a first region of material and forming a second region of material at a position relative to the first region of material. A disposable spacer is then formed of germanium-silicon alloy in contact with a portion of the second region of material. A portion of the first region of material offset from the second region of material by the disposable spacer is then etched.

Another method for use in fabrication of semiconductor devices is also described. The method includes providing a device structure and forming a germanium-silicon layer on the device structure. A disposable spacer aligned to a first portion of the device structure is formed from the germanium-silicon layer to allow for materially altering a second portion of the device structure. The second portion of the device structure is offset relative to the first portion of a device structure by the disposable spacer.

A method for use in fabrication of MOS devices is also provided. The method includes providing a substrate and having a gate structure formed thereon. The gate structure includes at least one sidewall. A germanium-silicon layer is formed over the gate structure and substrate. A disposable spacer is formed from the germanium-silicon layer on the at least one sidewall and a portion of substrate offset from the gate structure by the disposable spacer is implanted.

In one embodiment of this method, the substrate includes both PMOS and NMOS devices fabricated thereon. The disposable spacer is used to offset implant of the substrate relative to the gate structure of a PMOS device.

In another method for use in fabrication of semiconductor devices, the method includes providing a substrate having an oxidation mask thereon. The oxidation mask includes at least one sidewall. Oxide is formed on the substrate. A germanium-silicon layer is formed over the oxidation mask and substrate, and a disposable spacer is formed from the germanium-silicon layer on the at least one sidewall. The substrate offset from the oxidation mask by the disposable spacer is implanted.

In various embodiments of the method, the oxidation mask is a silicon nitride mask. Further, the germanium-silicon layer is formed, the disposal spacer is formed, and the substrate implanted before or after the oxide formation. And yet further, the substrate may be implanted at a point during oxide formation.

BRIEF DESCRIPTION OF THE DRAWINGS

FIGS. 2A–2F are illustrations showing conventional processing steps for a CMOS device structure including NMOS and PMOS devices.

FIGS. 3A–3E are illustrations of processing steps in accordance with the present invention to form and utilize the germanium-silicon alloy disposable spacer in the fabrication of CMOS devices.

FIGS. 4A–4E are illustrations of conventional LOCOS processing steps.

FIGS. 5A–5D are illustrations of LOCOS processing utilizing the germanium-silicon alloy disposable spacers in accordance with the present invention.

DETAILED DESCRIPTION OF THE EMBODIMENTS

Figure 1A:
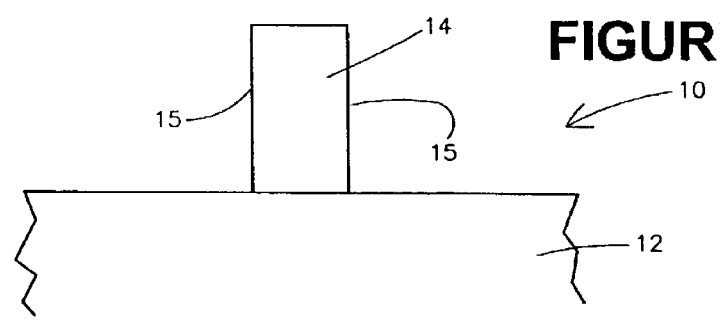
FIGS. 1A–1D generally shows the steps of formation and use of the disposal spacer in accordance with the present invention.

The formation and utilization of germanium-silicon disposable spacers in accordance with the present invention shall be generally described with reference to FIGS. 1A–1D. As shown in FIG. 1A, a device structure 10 may include various regions of material. Device structure 10 includes first region of material 12 and second region of material 14. For example, and as will be described in further detail below, the first region of material 12 may be a silicon substrate, portions of which are to be doped, and second region of material 14 may be, for example, an oxidation mask or any other device structure typically used in fabrication processes. Further, the regions of material may have various surfaces, such as, for example, sidewalls 15 of the second region of material 14.

During the fabrication of various semiconductor devices, spacers are utilized to offset implants and/or etches for various device structures. The present invention contemplates the use of germanium-silicon alloy ($Ge_{(x)}Si_{(1-x)}$) disposable spacers for use in performing various fabrication processes, such as, for example, offset implants or etches. The device structures with which the germanium-silicon disposable spacers are utilized may include any and all materials typically utilized in a fabrication process as are known to those skilled in the art.

Figure 1B:
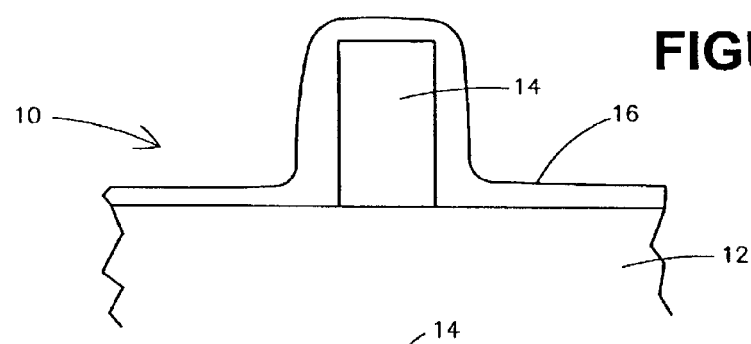

To form the germanium-silicon disposable spacers, a germanium-silicon alloy layer 16 is formed conformally over the device structure 10, including the first and second regions of material 12 and 14 as shown in FIG. 1B. The germanium-silicon alloy layer 16 ($Ge_{(x)}Si_{(1-x)}$) is made of a first portion of germanium (x) and a second portion of silicon (1-x) in the alloy structure. Various percentages of germanium and silicon, such as wherein x is greater than about 0.2 provide benefits in accordance with the present invention. Preferably, x is greater than about 0.7 and even greater 0.9. As used herein, $Ge_{(x)}Si_{(1-x)}$ and the alloy description including a first portion of germanium (x) and a second portion of silicon (1-x), are equivalents.

The germanium-silicon alloy layer 16 may be formed by any known method. For example, the germanium-silicon alloy may be deposited by conventional sputtering or chemical vapor deposition techniques, or grown by gas source silicon molecular beam epitaxy as noted in the article by Koyama et. al., entitled "Etching characteristics of $Si_{1-x}Ge_x$ alloy in ammoniac wet cleaning," Appl. Phys. Lett. Vol. 57, No. 21, Nov. 19, 1990, pages 2202–04, herein entirely incorporated by reference. As chemical vapor deposition generally provides better step coverage it is preferably utilized. Such chemical vapor deposition (CVD) of the germanium-silicon layer may be performed, for example, at a temperature in the range of about 400° C. to about 600° C., preferably about 400° C. to about 500° C. The layer formed may be of a thickness of about 200 Å to about 1000 Å.

Figure 1C:
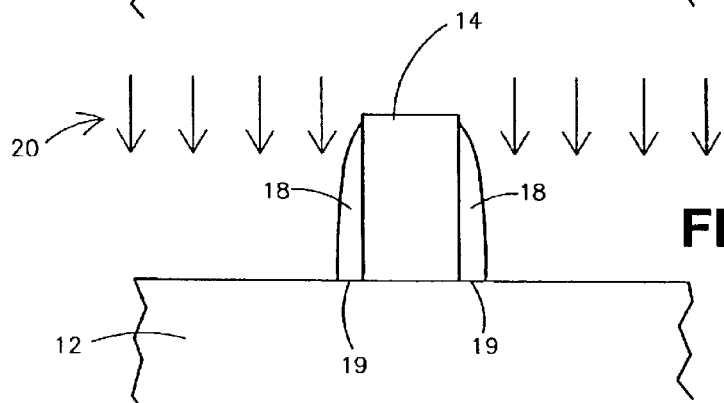

The germanium-silicon layer 16 is then etched to form disposable spacers 18, as shown in FIG. 1C, which are aligned to existing structures such as the second region of material 14. The spacers 18 are in contact with a portion of the first region of material 12 at the base 19 of the spacers 18. To form the disposable spacers 18, the germanium-silicon layer 16 is preferably dry etched utilizing a plasma, including a fluorine and/or chlorine containing gas, in much the same manner as polysilicon is dry etched. For example, such plasma may be a $CF_4$, a $Cl_2$, an $NF_3$, or any other fluorine and/or chlorine containing gas.

Although various examples are given for forming the germanium-silicon alloy layer 16 and also for etching the layer 16, it should be readily apparent to one skilled in the art that the present invention is not limited to such illustrative examples. Such processes of formation and etching may be performed by any method suitable for forming and etching a germanium-silicon alloy layer and the present invention is limited only as described in the accompanying claims. For example, sputtering may be performed in various manners, CVD may be performed in various manners and at various parameters (i.e. low pressure CVD, plasma enhanced CVD, etc.), and etching may include any anisotropic etch using various solutions or plasmas.

After the spacers 18 have been formed, at least one portion of the first region of material 12 is materially altered. Such alteration may occur as a result of an etchant or as a result of ion implantation. Such etchant or ion implantation is represented generally by the arrows 20.

Figure 1D:
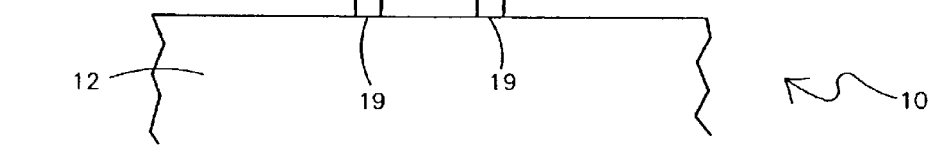

As shown in FIG. 1D, the material alteration of the portions of the first region of material 12 result in materially altered regions 22. For example, if an ion implantation 20 is performed, regions 22 would be ion implanted regions offset relative to the second region of material 14, or if an etching step was performed, then the dashed lines 22 represent regions of the first region of material 12 offset a distance relative to the second region of material 14 that would be removed by means of the etchant. It should be readily apparent to one skilled in the art that both an etch and an implant or any other process may be carried out using the same spacer or carried out using different disposable spacers at different processing points of the device being fabricated.

After the offset implant or etch of the portions of the first region of material 12 relative to the second region of material 14, the disposable spacers 18 are removed. The germanium-silicon alloy disposable spacers 18 are easily removed with good selectivity to other materials typically utilized in semiconductor fabrication processes such as, for example, silicon nitride and oxides. The method of removing the germanium-silicon alloy disposable spacers 18 varies depending upon the content of the disposable spacers 18. If the germanium content is high relative to the silicon content, i.e., greater than about 20% germanium, then the germanium-silicon spacer is preferably removed by oxidation and volatilization of the disposable spacers 18 followed by a water rinse. In removing the germanium-silicon disposable spacers 18 by oxidation, the device structure 10, including the spacers 18, are oxidized at a temperature less than about 750° C. In this range, germanium will oxidize and $Ge_xSi_yO$ will be formed. The $Ge_xSi_yO$ gas is then removed. Any unvolatilized $Ge_xSi_yO$ remaining is water soluble and is removed with a deionized water rinse.

In another process of removing the disposable spacers 18, such as when the silicon content is towards the 80% range, an ammonium hydroxide wet clean is utilized, such as an RCA clean as described in the Koyama et al. reference listed above. The removal will, of course, depend upon the content of the alloy and amount of material to be removed.

The germanium-silicon alloy disposable spacers 18 are stable to withstand ion implantation. Further, the germanium-silicon spacers 18 have good selectivity to various other materials used in semiconductor fabrication processes, such as oxides, nitrides, or polysilicon to allow for easy removal.

Therefore, in accordance with the present invention, a disposable spacer made of germanium-silicon alloy is utilized during the fabrication process to allow for offset of implants and/or etches, or any other process that may benefit from use of such a disposable spacer. Further, the germanium-silicon disposable spacers are easily removed with good selectivity to various other materials in the semiconductor fabrication processes, and therefore, the spacers use does not interfere with such existing processes. The germanium-silicon disposable spacers are easily integrated into well established process flows, such as those described in the illustrations below. The illustrations given below describe two process flows which benefit from the use of the germanium-silicon disposable spacer formed in accordance with the present invention. However, there are various other offset implant and offset etching processes which may benefit from the use of a germanium-silicon disposable spacer and the present invention as described herein is not limited to only those process flows illustrated but only as described in the accompanying claims.

The first illustrative process flow utilizing the germanium-silicon alloy disposable spacers in accordance with the present invention shall be described with reference to FIGS. 2A–2F, which illustrates conventional processing associated with ion implantation in the fabrication of CMOS devices, and with reference to FIGS. 3A–3E, which illustrates ion implantation of CMOS devices utilizing disposable spacers in accordance with the present invention. In particular, the process described with reference to FIGS. 3A–3E provides for the optimization of spacer width for PMOS devices resulting in lengthened gate channels relative to the conventional processing techniques described with reference to FIGS. 2A–2F. Further, the offset implant is described relative to the PMOS gate structure such that the narrowing down of the gap between the gates being fabricated is prevented.

FIG. 2A shows an illustrative cross-section of a wafer after gate and permanent spacer formation in a conventional CMOS process before the source and drain for the PMOS and NMOS devices are implanted. As shown in FIG. 2A, the CMOS device structure 30, at this point in the process, includes N-well 34 and P-well 32. Field oxide regions 36, 38, and 40 have also been formed. Further, NMOS gate 42 and PMOS gate 44 have been formed in addition to stack 46. The NMOS gate 42 includes, for example, a polysilicon region 43 and a metal silicide region 45 (i.e. tungsten silicide), along with permanent spacers 48 and a nitride cap 49 thereover. PMOS gate 44 includes similar regions including permanent spacers 52, and stack 46 also includes similar regions including permanent spacers 50.

After formation of the permanent spacers 48, 50, and 52, as shown in FIG. 2A, conventional photolithography utilizing photoresist 58 is performed to implant n-type ions, such as, for example, arsenic, into P-well 32, as generally represented by arrows 60. N-type active regions 62 are formed therefore in P-well 32 on respective sides of NMOS gate 42. The permanent spacers 48 provide for offset of the arsenic ion implantation relative to the NMOS gate 42 to keep the channel width at a desired length while allowing for some diffusion of arsenic ions into the gate channel.

Figure 2D:
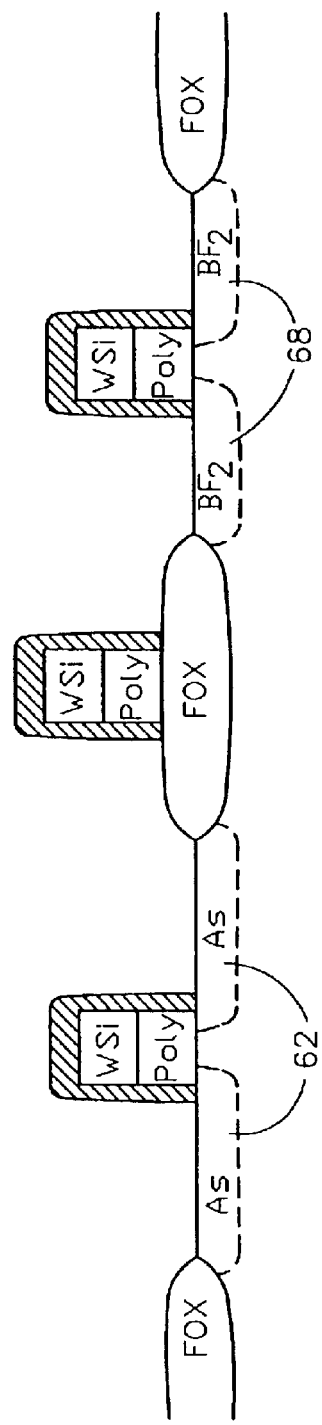

After completion of the arsenic ion implantation, as shown in FIG. 2B, conventional photolithography utilizing photoresist 64 is then utilized to implant p-type dopant ions into N-well 34 for formation of p-type active regions 68, as shown in FIG. 2C. For example, the ion implantation may include the use of boron difluoride to implant boron ions to create the p-type active regions 68 as generally shown by arrows 66. The implantation of boron difluoride ions is offset from PMOS gate 44 by permanent spacers 52 formed at the same time as permanent spacers 48, and, therefore, of substantially the same width. After the boron difluoride ion implantation is performed, the photoresist 64 is removed, resulting in the device structure as shown in FIG. 2D.

The problem associated with such conventional processes as just described is best shown and described with reference to FIGS. 2E and 2F, which are enlarged illustrations of the gate region of the NMOS device including gate 42 and respective n-type active areas 62 and of the gate region of the PMOS device including gate 44 and respective p-type active regions 68, respectively. FIG. 2E and FIG. 2F show the typically short channel behavior which is caused by lateral diffusion of p-type ions, such as boron, after the boron difluoride ion implantation. As the permanent spacer width of both spacers 48 and spacers 52 for the offset of implantation from the gate edge of both the NMOS and PMOS gates 42, 44, is usually optimized for the NMOS devices, the permanent spacers 52 for the PMOS gate 44 are too small to account for the larger diffusion of boron in the gate channel of the PMOS device. As shown in FIG. 2E, the gate channel width after implantation is shown by the distance 70. This channel width is adequate for NMOS device characteristics as the permanent spacers 48 are of a width optimized to account for the lateral diffusion of n-type dopant into the channel. Even after additional heating steps, the channel distance 71 is adequate to provide the desired NMOS characteristics. Again, this is because the permanent spacers 48 have a width optimized for providing for such a gate channel distance.

However, the gate channel width 72 for the PMOS device, as shown in FIG. 2F, becomes inadequate (i.e., channel distance 73) for PMOS circuit characteristics after heat treatments are performed with respect to the fabrication of the devices, for example, such as reflow heat treatments. Lateral diffusion of p-type dopants, such as, for example, boron into the channel leaves a gate channel distance 73, that is undesirable.

With use of germanium-silicon alloy disposable spacers in accordance with the present invention, the ion implant utilizing p-type dopants, such as, for example, boron, is offset giving more room for lateral diffusion without causing short channel effects in the PMOS device. Further, a wet clean removal and/or removal of the disposable spacers by oxidation, as previously described, at a temperature below about 750° C. will not cause an enhanced lateral diffusion of the boron after implant. Yet further, such removal results in no field oxide loss, and with the removal of the disposable spacers after they are used for the offset implant, gap distances between the gates remain unchanged.

Figure 3B:
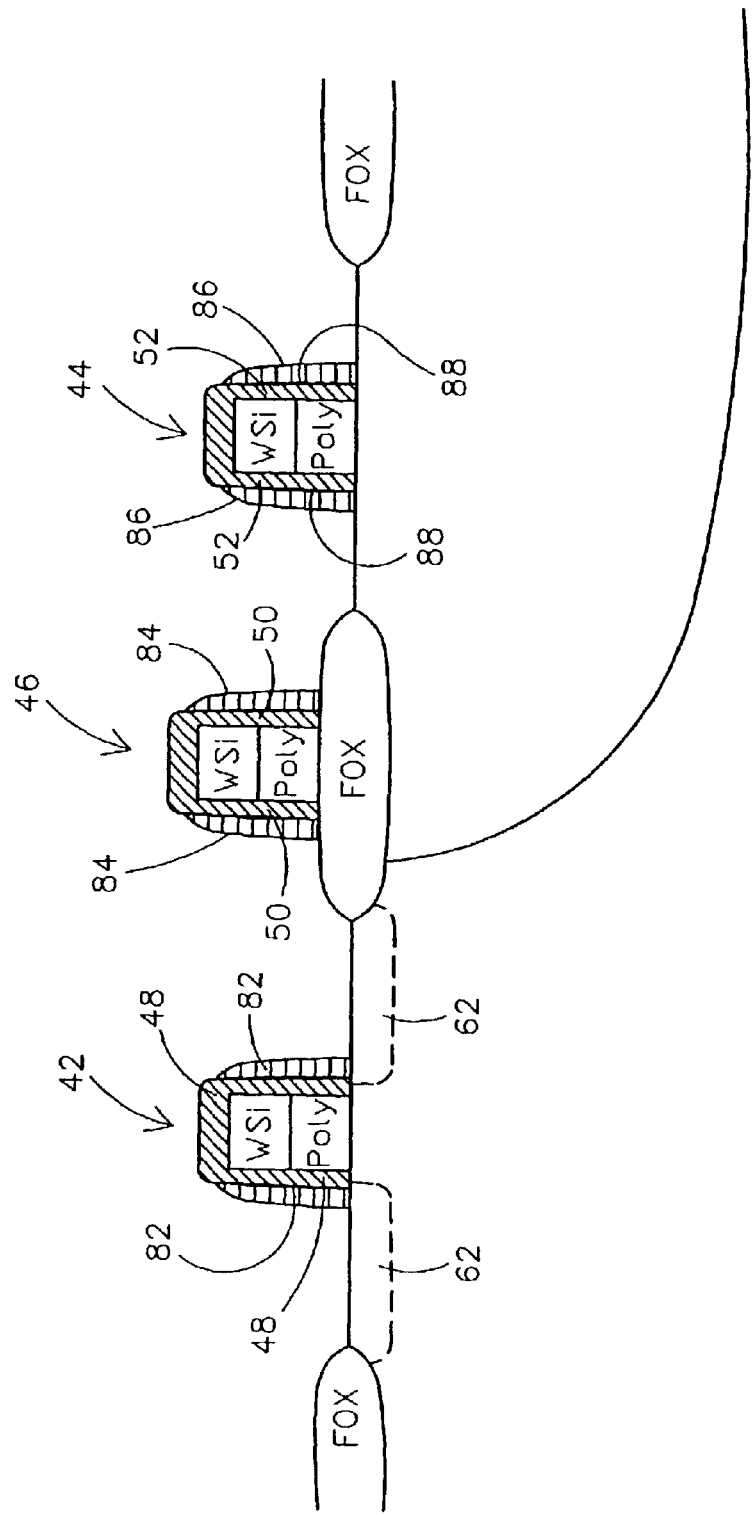
Figure 3C:
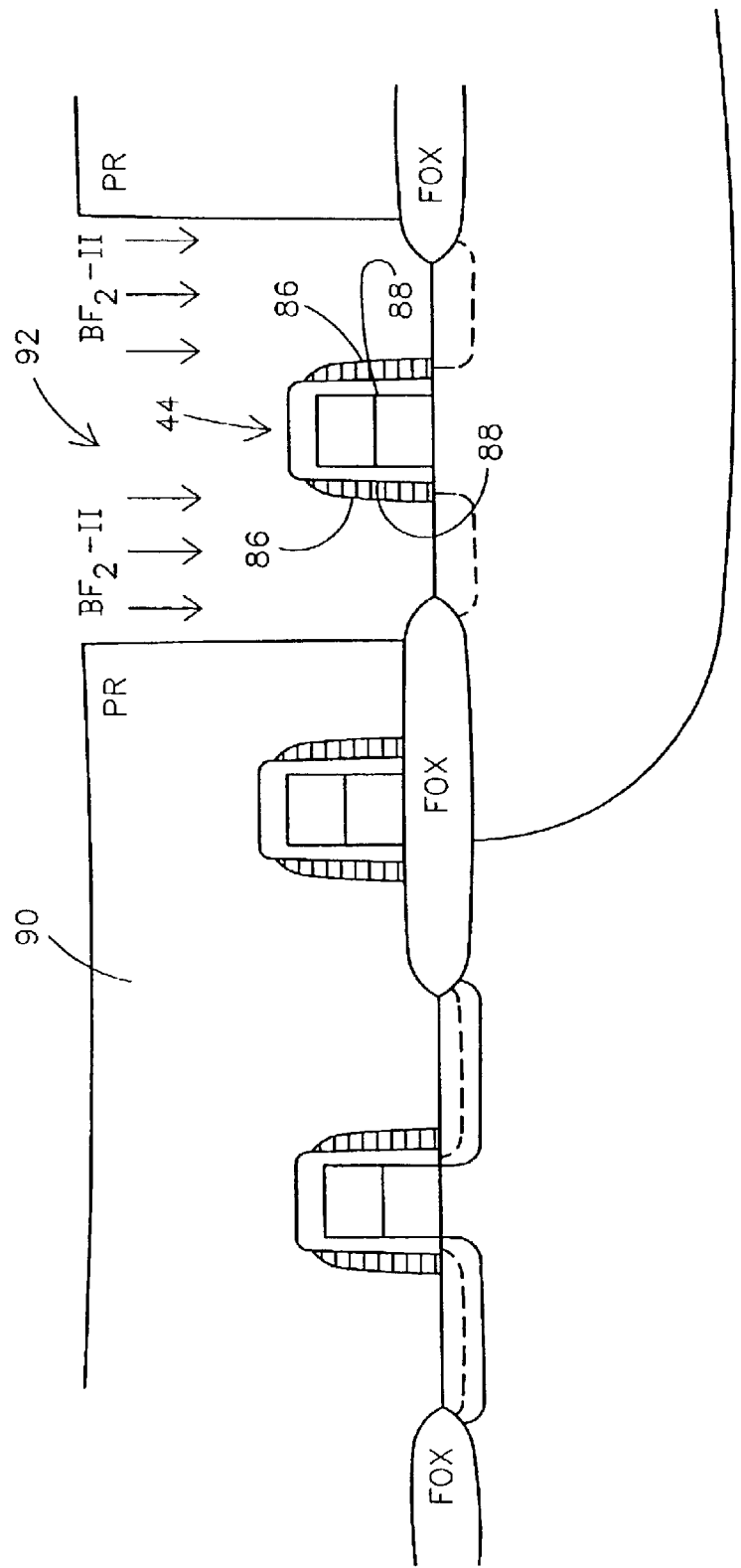

The optimization of spacer width and resulting length in gate channels of PMOS devices is described with reference to FIGS. 3A–3E. After implantation of n-type dopant (such as arsenic) to form the active regions 62 of the device structure 30 shown in FIG. 2B and removal of photoresist 58, the present invention includes depositing a layer of germanium-silicon alloy 80 over the CMOS device structure as shown in FIG. 3A. The germanium-silicon alloy layer 80 is conformally deposited on the device structure, including the surfaces of permanent spacers 48, 50, and 52 in a manner previously described.

After deposition of the germanium-silicon alloy layer 80, the layer 80 is dry etched to form germanium-silicon disposable spacers aligned to the permanent spacers. Disposable spacers 82 are aligned to sidewalls of permanent spacers 48 of the NMOS gate 42, disposable spacers 84 are aligned with permanent spacers 50 of stack 46, and disposable spacers 86 are aligned with sidewalls 88 of the permanent spacers 52 of PMOS gate 44.

Photolithography techniques are then utilized to implant a p-type dopant, such as boron, as shown generally by arrows 92, to form p-type regions 94 offset from gate 44 by the disposable spacers 86. The photoresist 90 is then removed after the ion implantation 92 is completed forming the p-type (i.e., boron) regions 94. The disposable spacers 82, 84, and 86 are then removed by oxidation or wet etching, as previously described.

FIGS. 3D and 3E show the resulting NMOS and PMOS gate regions, respectively, in an enlarged illustration. As shown in FIG. 3D, the gate channel distance 70 for the NMOS device is left unchanged relative to conventional processing. However, with use of the germanium-silicon alloy disposable spacers 86 in accordance with the present invention, the channel distance 95 is increased and can be optimized by offsetting the p-type dopant implant relative to the gate structure. After heat treatments, lateral diffusion of boron into the gate channel still results in a gate channel distance 96 that provides adequate PMOS characteristics as the offset implant is optimized to allow for such diffusion.

Although the above illustration has been described with reference to the implant of boron ions, utilizing boron difluoride, other ion implantation processes, such as, for example, implanting arsenic, phosphorous, or any other ion implanted in fabrication processes can likewise be offset from device structure as would be known and apparent to one skilled in the art. The present invention is not limited to the ion implantation illustration above, but is only limited as described in the accompanying claims.

Figure 4A:
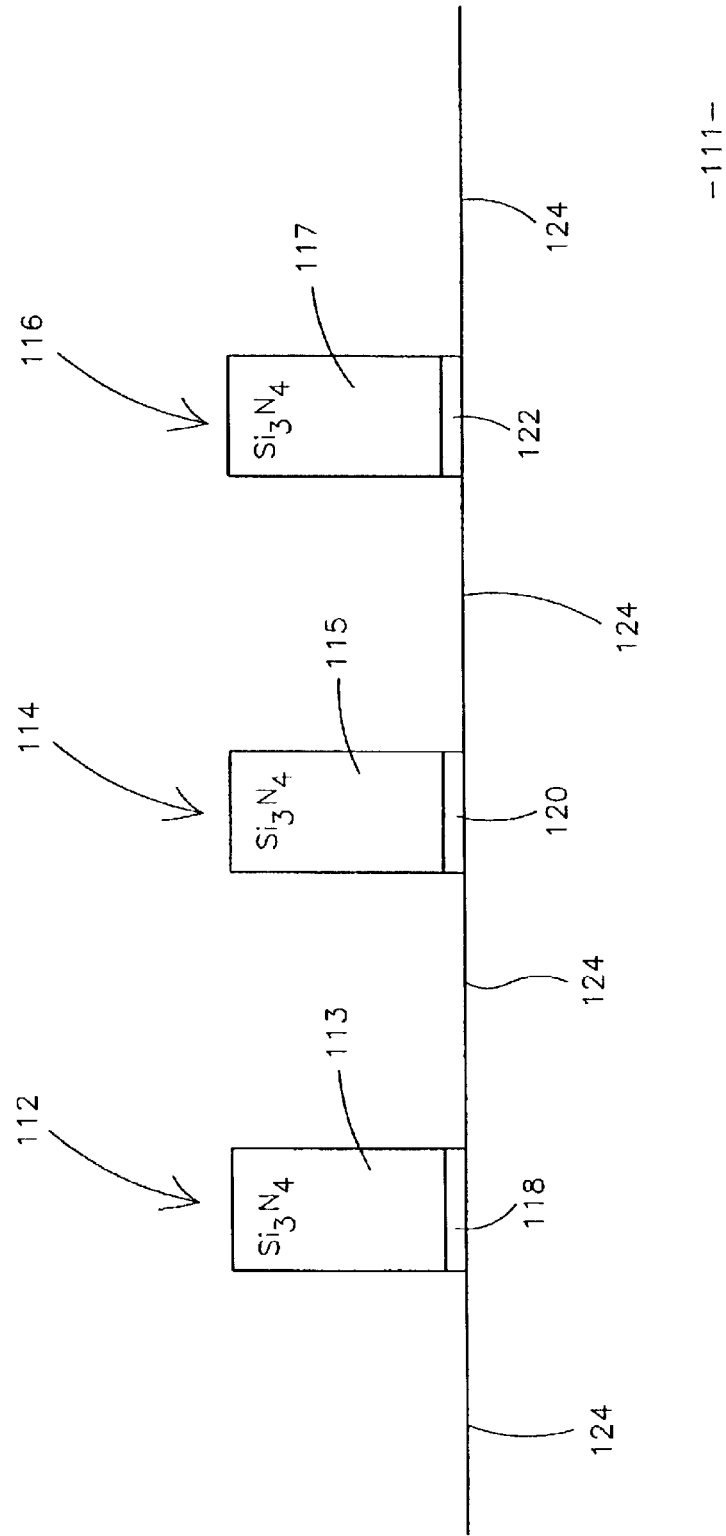
Figure 4C:
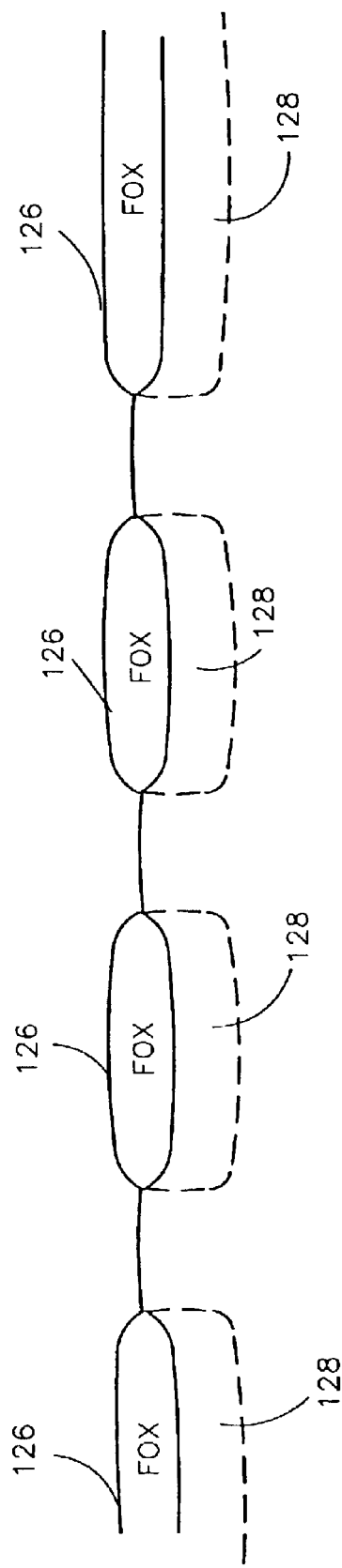

A further illustration of the utilization of the disposable spacers in accordance with the present invention shall be described with reference to conventional LOCOS processing steps, as illustrated in FIGS. 4A–4E, and LOCOS processing in accordance with the present invention utilizing germanium-silicon alloy disposable spacers, as illustrated in FIGS. 5A–5D. The conventional LOCOS process, as shown in FIGS. 4A–4E, includes forming an oxidation mask (such as LOCOS stacks 112, 114, and 116) on silicon substrate 111. For example, the stacks 112, 114, and 116 may include silicon nitride regions 113, 115, and 117, respectively, over an oxide pad, as shown by regions 118, 120, and 122, respectively. The oxidation mask, as shown in FIG. 4A, allows for oxidation in regions 124. Typically, a self-aligned field implant (i.e., channel stop implant) is utilized for isolation of devices formed between the regions 124. As shown in FIG. 4B, the field implant generally represented by arrows 125 may be performed before, during, or after the field oxidation formation of field oxide regions 126. The field implant creates channel stop regions 128. After the field oxide is grown and the channel stop regions 128 are formed, the final LOCOS profile before gate formation is shown in FIG. 4C, i.e., the oxidation mask is removed.

Figure 4D:
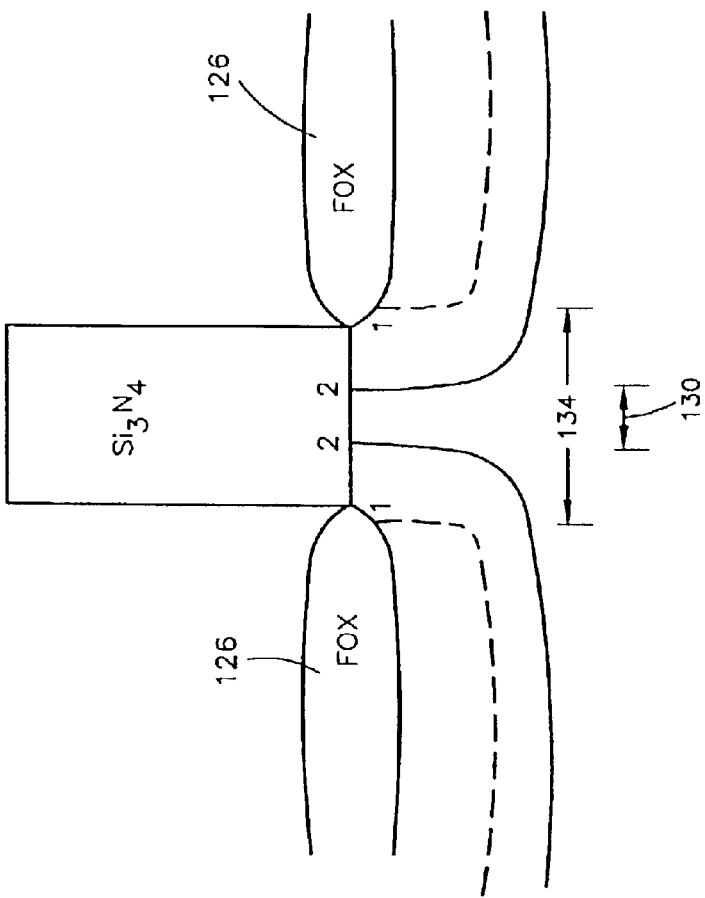
Figure 4E:
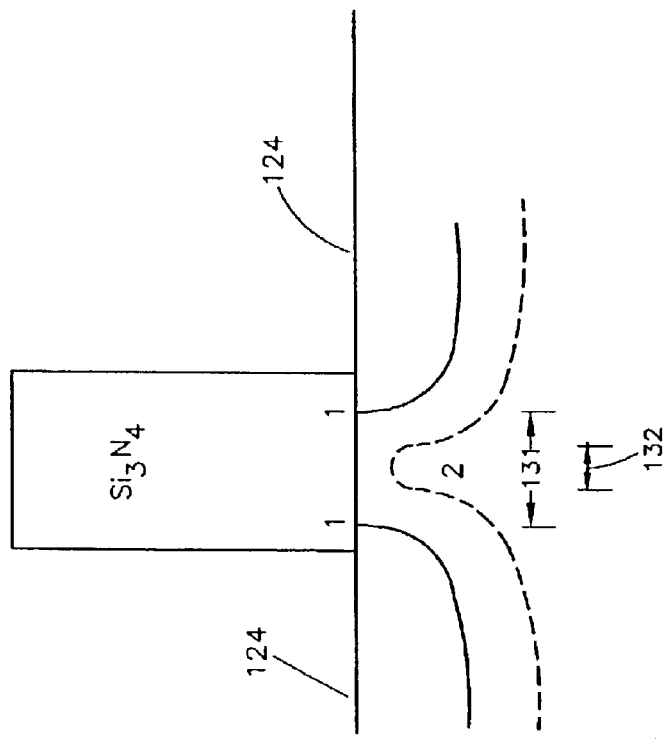

With respect to conventional processing, lateral diffusion of the ions implanted by the channel stop implant reduce the channel width between the regions 124 and field oxide regions 126, as shown in FIGS. 4D and 4E, respectively, particularly after heat treatment. FIG. 4D shows a channel width 131 after ion implantation prior to field oxide growth, and a channel width 132 after heat treatment, also prior to field oxide growth. FIG. 4E shows the lateral diffusion of the ion implantation after field oxide has been grown. For example, prior to heat treatment, the channel width 134 decreases to a channel width 130 after heat treatment due to lateral diffusion. Such decreased channel widths are undesirable.

Figure 5A:
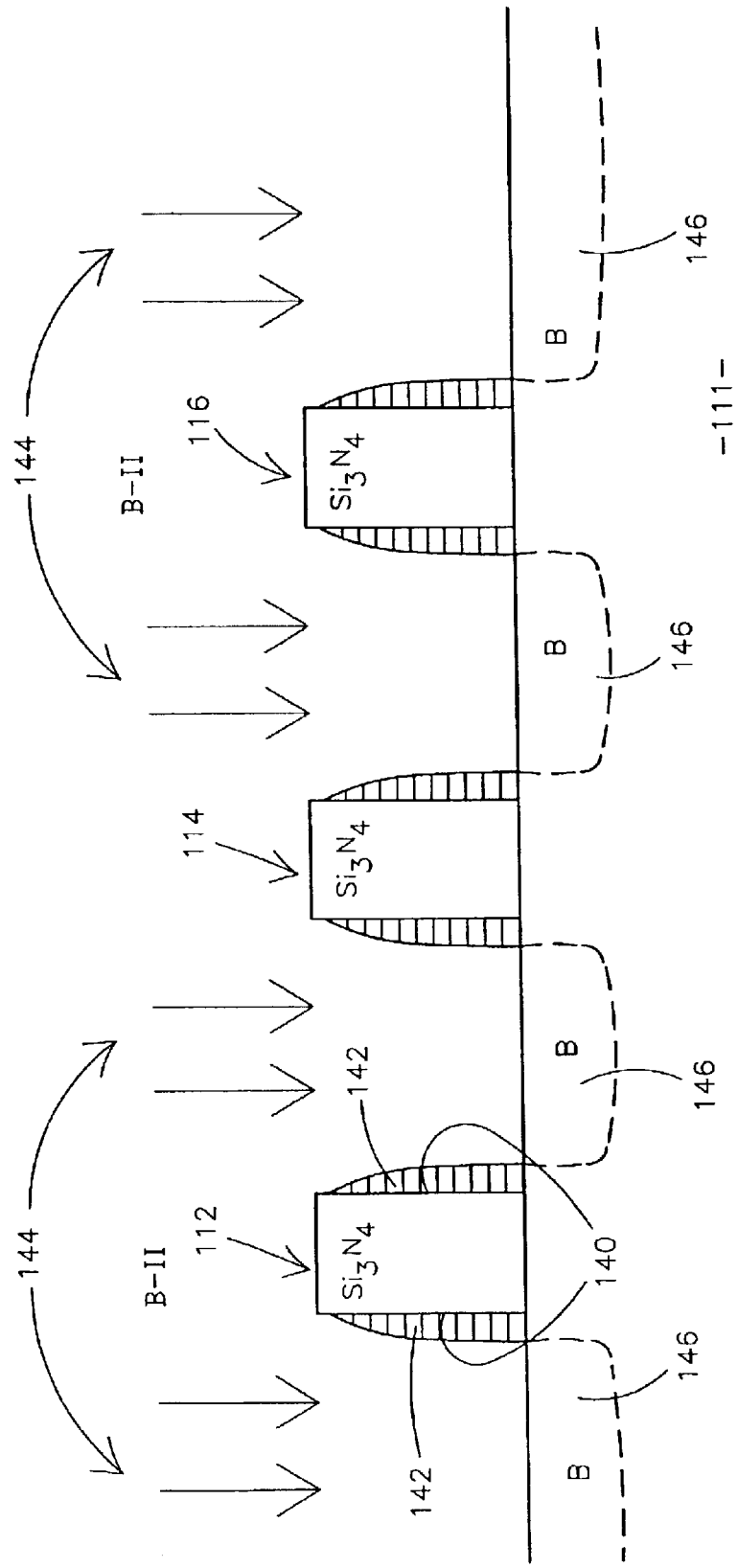

In accordance with the present invention, the LOCOS process utilizing the germanium-silicon alloy disposable spacers provide a channel that is not shortened due to lateral diffusion of a dopant material for the channel stop implant. As shown in FIG. 5A, the silicon nitride oxidation mask or any other oxidation mask is formed on substrate 111. Germanium-silicon disposable spacers 142 are then formed in the same manner as described with reference to FIGS. 3A and 3B.

The spacers may be formed for offset of the implant from the LOCOS stacks 112, 114, and 116 before the field oxide is grown. The disposable spacers 142 may also be formed and the implant performed after the field oxide regions 126 are grown, as shown in FIG. 5B. Likewise, the ion implantation may be performed and the disposable spacers formed at any point in time during the growth of the field oxide. The required stopping power for the implant determines at which field oxide thickness the implant is to be done. At any time between, during, or after the field oxidation, the disposable spacers 142 provide the offset required for the channel stop implant.

The channel stop implant may be, for example, an implantation of boron or any other channel stop dopant as required for performing the desired function. The channel stop implant is generally represented by arrows 144. The channel stop implant creates channel stop regions 146 as shown in FIGS. 5A and 5B and also shown in the enlarged illustrations of FIGS. 5C and 5D.

Figure 5C:
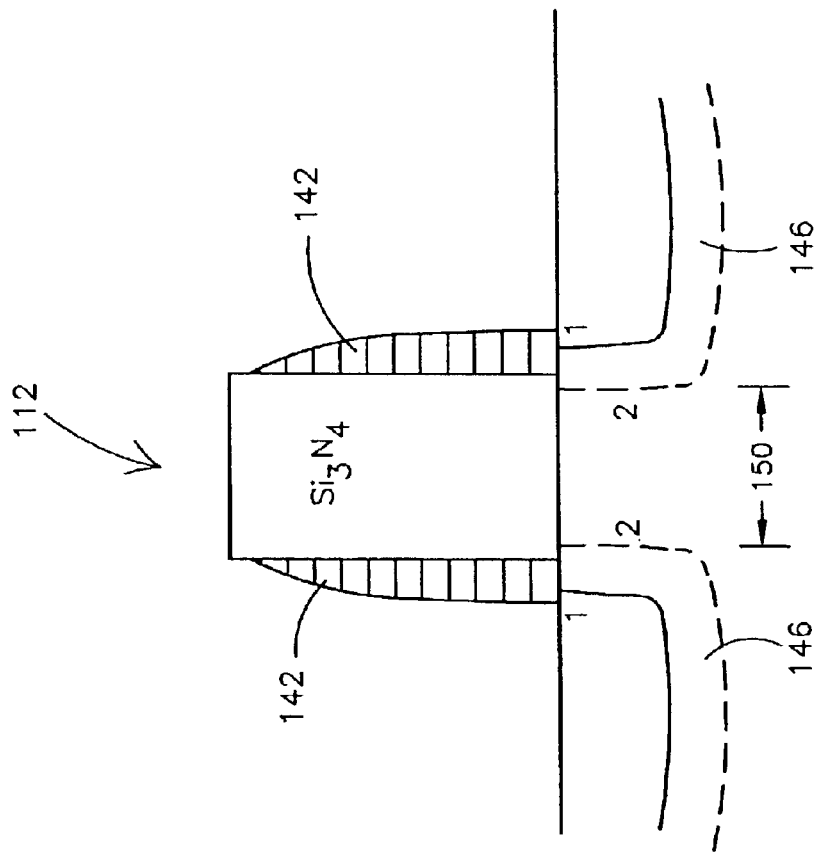
Figure 5D:
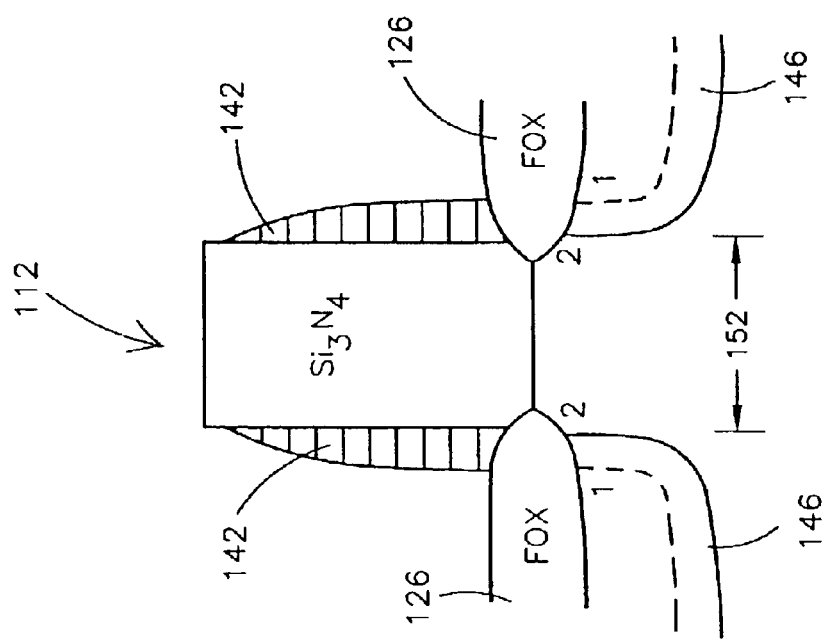

As shown in FIG. 5C, the channel distance 150 (after heat treatment) is optimized for later device processing by offsetting the implant relative to the oxidation mask using the disposable spacers 142 allowing for the lateral diffusion of ions into the channel region yet maintaining suitable channel length. Further, as shown in FIG. 5D, when the spacer and the implant is performed after the field oxide has been grown, the channel distance 152 is also optimized by offsetting the implant relative to the oxidation mask a suitable distance to provide the desired length of the channel formed.

As would be known to one skilled in the art, the germanium-silicon disposable spacer, such as that shown in FIG. 5A, may also be utilized to offset the etch of a trench in the silicon substrate 111 as opposed to implanting ions offset from mask 112. Further, it is possible that the same disposable spacer may be utilized for etching the trench offset from the oxidation mask in the LOCOS process, as well as for offsetting the implant for creating the channel stop regions.

It is again noted that the illustrations described above are provided to describe several semiconductor fabrication processes which utilize the disposable spacer made of germanium-silicon alloy in order to offset an implantation or an etch from various device structures. The present invention contemplates the use of such germanium-silicon disposable spacers for many and various offset implants or etches during the fabrication of semiconductor devices or any other processes where such a disposable spacer may be beneficial.

Although the invention has been described with particular reference to a preferred embodiments thereof, variations and modifications of the present invention can be made within a contemplated scope of the following claims as is readily known to one skilled in the art.

What is claimed is:

1. A method for use in the fabrication of semiconductor devices, the method comprising:

providing a substrate having an oxidation mask thereon, wherein the oxidation mask comprises at least one sidewall;

forming field oxide on the substrate, wherein forming the field oxide on the substrate comprises using the oxidation mask during the formation of the field oxide to define regions of the substrate on which the field oxide is to be formed;

forming a germanium-silicon layer over the oxidation mask and substrate;

forming a disposable spacer using the germanium-silicon layer on the at least one sidewall;

implanting a portion of the substrate offset from the oxidation mask by the disposable spacer; and removing the oxidation mask and the disposable spacer after forming the field oxide and implanting the portion of the substrate.

2. The method according to claim 1, wherein the oxidation mask comprises a silicon nitride mask.

3. The method according to claim 2, wherein an oxide pad is provided below the silicon nitride mask.

4. The method according to claim 1, wherein the germanium-silicon layer is formed, disposable formed, and the substrate implanted before the field oxide is formed.

5. The method according to claim 1, wherein the substrate is implanted at a time during the field oxide growth.

6. The method according to claim 1, wherein the germanium-silicon layer is formed, the disposable is formed, and the substrate is implanted after the field oxide is formed.

7. The method according to claim 1, wherein the disposable spacer comprises a first portion (x) of germanium and a second portion (1-x) of silicon, wherein x is greater than about 0.2.

8. The method according to claim 7, wherein x is greater than about 0.7.

9. A method for use in the fabrication of semiconductor devices, the method comprising:

providing a substrate having an oxidation mask thereon, wherein the oxidation mask comprises at least one sidewall;

forming field oxide on the substrate, wherein forming the field oxide on the substrate comprises using the oxidation mask during the formation of the field oxide to define regions of the substrate on which the field oxide is to be formed;

forming a germanium-silicon layer over the oxidation mask and substrate;

forming a disposable spacer using the germanium-silicon layer on the at least one sidewall;

implanting a portion of the substrate offset from the oxidation mask by the disposable spacer;

etching a trench in the substrate offset from the oxidation mask by the disposable spacer; and removing the oxidation mask and the disposable spacer after forming the field oxide and implanting the portion of the substrate.

10. The method according to claim 9, wherein the oxidation mask comprises a silicon nitride mask.

11. The method according to claim 10, wherein an oxide pad is provided below the silicon nitride mask.

12. The method according to claim 9, wherein the germanium-silicon layer is formed, the disposable spacer formed, and the substrate implanted before the field oxide is formed.

13. The method according to claim 9, wherein the substrate is implanted at a time during the field oxide growth.

14. The method according to claim 9, wherein the germanium-silicon layer is formed, the disposable spacer is formed, and the substrate is implanted after the field oxide is formed.

15. The method according to claim 9, wherein the disposable spacer comprises a first portion (x) of germanium and a second portion (1-x) of silicon, wherein x is greater than about 0.2.

16. The method according to claim 15, wherein x is greater than 0.7.

17. A method for use in the fabrication of semiconductor devices, the method comprising:

providing a substrate having an oxidation mask thereon, wherein the oxidation mask comprises at least one sidewall;

forming field oxide on the substrate, wherein forming the field oxide on the substrate comprises using the oxidation mask during the formation of the field oxide to define regions of the substrate on which the field oxide is to be formed;

forming a germanium-silicon layer over the oxidation mask and substrate;

forming a disposable spacer using the germanium-silicon layer on the at least one sidewall, wherein the disposable spacer comprises a first portion (x) of germanium and a second portion (1-x) of silicon, wherein x is greater than about 0.7;

implanting a portion of the substrate offset from the oxidation mask by the disposable spacer; and removing the oxidation mask and the disposable spacer after forming the field oxide and implanting the portion of the substrate.

18. The method according to claim 17, wherein the oxidation mask comprises a silicon nitride mask.

19. The method according to claim 18, wherein an oxide pad is provided below the silicon nitride mask.

20. The method according to claim 17, wherein the germanium-silicon layer is formed, the disposable spacer formed, and the substrate implanted before the field oxide is formed.

21. The method according to claim 17, wherein the substrate is implanted at a time during the field oxide growth.

22. The method according to claim 17, wherein the germanium-silicon layer is formed, the disposable spacer is formed, and the substrate is implanted after the field oxide is formed.

* * * * *

UNITED STATES PATENT AND TRADEMARK OFFICE
CERTIFICATE OF CORRECTION

PATENT NO. : 6,777,297 B2
DATED : August 17, 2004
INVENTOR(S) : Werner Juengling It is certified that error appears in the above-identified patent and that said Letters Patent is hereby corrected as shown below:

Column 10,
Line 41, please delete, "disposable formed" and insert -- disposable spacer formed --;
Line 46, please delete, "the disposable is formed," and insert -- the disposable spacer is formed, --.

Signed and Sealed this

Twenty-second Day of February, 2005

JON W. DUDAS
*Director of the United States Patent and Trademark Office*